(12) United States Patent
Hirota (10) Patent No.: US 6,262,613 B1
(45) Date of Patent: Jul. 17, 2001

(54) PULSE DURATION CHANGER FOR STABLY GENERATING OUTPUT PULSE SIGNAL FROM HIGH-FREQUENCY INPUT PULSE SIGNAL AND METHOD USED THEREIN

(75) Inventor: Takuya Hirota, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/288,786

(22) Filed: Apr. 9, 1999

(30) Foreign Application Priority Data

Apr. 13, 1998 (JP) .................................................. 10-101092

(51) Int. Cl.[7] .............................. H03K 3/017; H03K 5/04; H03K 7/08
(52) U.S. Cl. ............................ 327/176; 327/172; 327/291
(58) Field of Search .................. 327/31, 34–36, 327/172–176, 291, 292

(56) References Cited

U.S. PATENT DOCUMENTS

| | | | |
|---|---|---|---|
| 5,163,168 | * | 11/1992 | Hirano et al. ........................ 327/176 |
| 5,264,737 | * | 11/1993 | Okikawa .............................. 327/172 |
| 5,642,068 | * | 6/1997 | Wojcicki et al. .................... 327/172 |
| 5,672,990 | * | 9/1997 | Chaw .................................... 327/176 |
| 5,764,090 | * | 6/1998 | Yeh et al. ............................. 327/174 |
| 5,920,222 | * | 7/1999 | Eustis et al. ......................... 327/176 |
| 5,933,032 | * | 8/1999 | Shah et al. ............................ 327/34 |
| 6,049,504 | * | 4/2000 | Suh ..................................... 327/164 |

FOREIGN PATENT DOCUMENTS

| | | |
|---|---|---|
| 3-8037 | 2/1991 | (JP) . |
| 4-358397 | 12/1992 | (JP) . |
| 6-303113 | 10/1994 | (JP) . |
| 8-180677 | 7/1996 | (JP) . |

* cited by examiner

*Primary Examiner*—Terry D. Cunningham
(74) *Attorney, Agent, or Firm*—Sughrue, Mion, Zinn, Macpeak & Seas, PLLC

(57) ABSTRACT

A pulse duration changer generates an output pulse signal longer in pulse duration than an input pulse signal, wherein the pulse duration changer firstly produces a first control pulse signal synchronous with the input pulse signal and shorter in pulse duration than the input pulse signal, thereafter, produces a second control pulse signal synchronous with the first control pulse signal and longer in pulse duration than the input pulse signal, and finally defines the pulse duration of a preliminary output pulse signal as long as the second control pulse signal, thereby keeping the pulse duration of the output signal constant when the input pulse signal has an ultra high frequency.

39 Claims, 5 Drawing Sheets

PULSE DURATION CHANGER FOR STABLY GENERATING OUTPUT PULSE SIGNAL FROM HIGH-FREQUENCY INPUT PULSE SIGNAL AND METHOD USED THEREIN

FIELD OF THE INVENTION

This invention relates to a pulse duration changer and, more particularly, to a pulse duration changer for generating an output pulse signal longer in pulse duration than and an input pulse signal and a method used therein.

DESCRIPTION OF THE RELATED ART

A high-frequency pulse signal is used in electronic system, and the system components are expected to respond to the high-frequency input signal. If a system component hardly responds to the high-frequency input signal, a pulse duration changer is required for the low-speed system component without destruction of information carried thereon.

Figure 1:
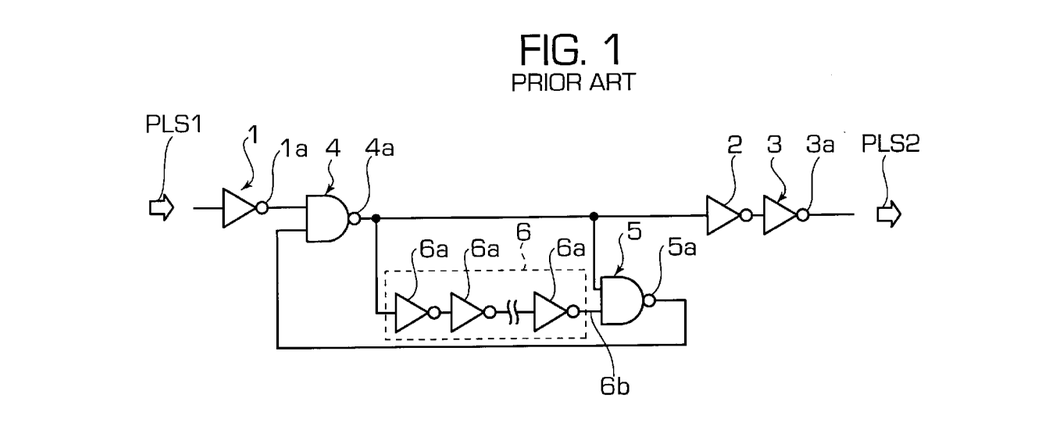
FIG. 1 is a circuit diagram showing the circuit configuration of the prior art pulse duration changer.

FIG. 1 illustrates the prior art pulse duration changer. The prior art pulse duration changer includes inverters 1, 2 and 3, NAND gates 4 and 5 and a delay circuit 6. An input pulse signal PLS1 is supplied to the input node of the inverter 1, and the inverter 1 amplifies the input pulse signal PLS1. The input pulse signal PLS1 is high frequency and small amplitude, and the inverter 1 increases the amplitude of the pulse signal PLS1. A differential amplifier serves as the inverter 1. The output node 1a of the inverter is connected one input node of the NAND gate 4, and an output node 5a of the other NAND gate 5 is connected to the other input node of the NAND gate 4.

The output node 4a of the NAND gate 4 is branched to three signal lines, and the three signal lines are respectively connected to the input node of the delay circuit, an input node of the NAND gate 5 and an input node of the inverter 2. The inverters 2 and 3 form an output circuit. The output circuit 2 and 3 amplifies the signal supplied from the NAND gate 4, and shapes the wave-form of the signal. A fine output pulse signal PLS2 is output from the output node 3a of the inverter 3, and the output pulse signal PLS2 varies the potential level in the potential range appropriate to MOS (Metal-Oxide-Semiconductor) field effect transistors.

The delay circuit 6 is implemented by a series of inverters 6a. Odd inverters 6a are connected in series, and inserted between the output node 4a of the NAND gate 4 and the other input node of the NAND gate 5. Thus, the delay circuit 6 and the NAND gate 5 form a feedback loop to the input node of the NAND gate 4. The prior art pulse duration changer is designed to change the pulse duration T1 and T6 of the input pulse signal PLS1 to the pulse duration T3 and T8 of the output pulse signal PLS2 (see FIG. 2). Even if the input pulse signal PLS1 varies the pulse duration T1 under value X1, the prior art pulse duration changer is designed to keep the pulse duration T3 of the output pulse signal PLS2 constant (see FIG. 3). However, the prior art pulse duration changer proportionally varies the pulse duration T3 together with the pulse duration T1 over the value X1.

Turning back to FIG. 2, the circuit behavior of the prior art pulse duration changer is described hereinbelow. The delay time T4 is assumed to be appropriately regulated with respect to the input pulse signal PLS1. In other words, the pulse duration T1 and T6 and the pulse period T9 and T10 of the input pulse signal PLS1 are appropriate to the delay time.

Figure 2:
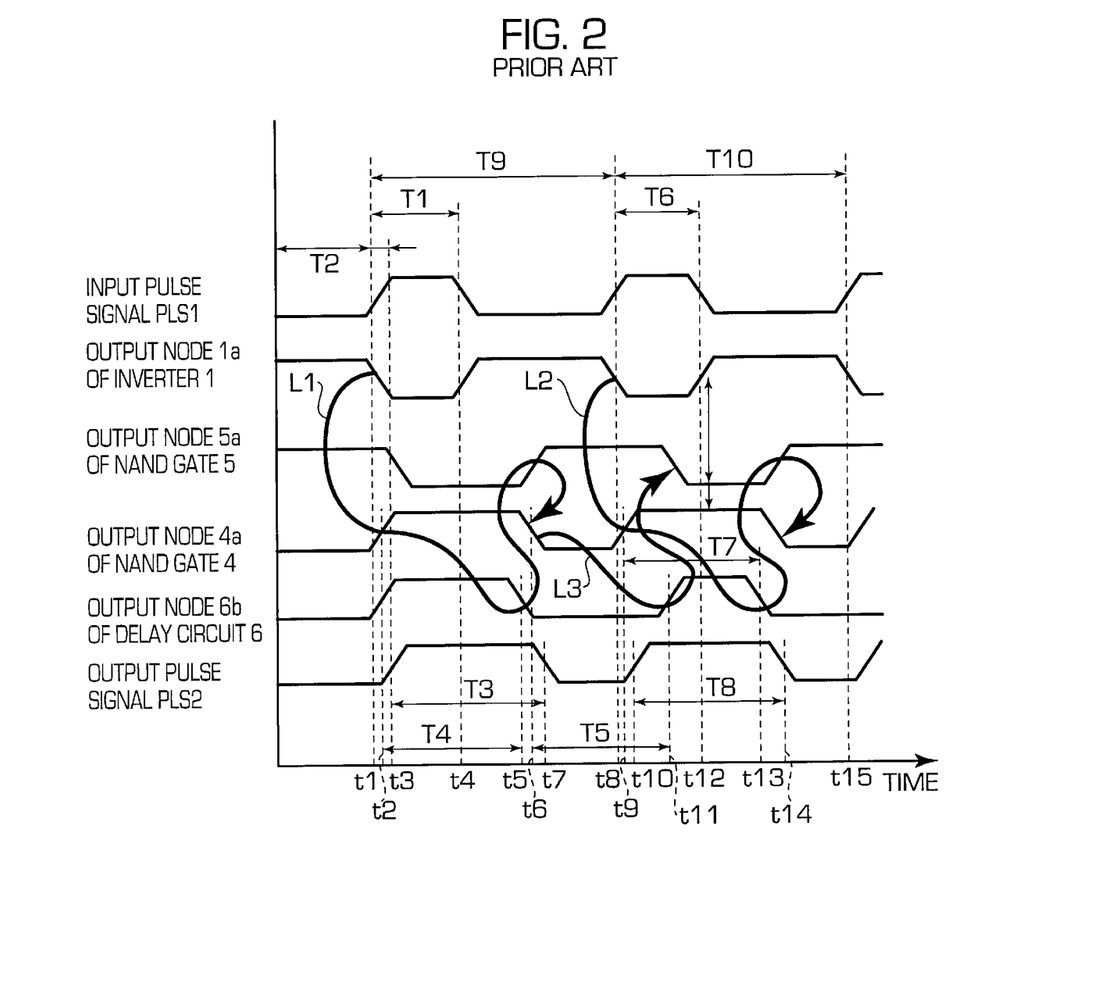
FIG. 2 is a diagram showing the signal waveforms observed in the prior art pulse duration changer.

The input pulse signal PLS1 is changed from a low level to a high level at time t1, and the inverter 1 changes the output node 1a from the high level to the low level. The output node 1a at the low level causes the NAND gate 4 to enter disable state, and the NAND gate 4 changes the output node 4a to the high level at time t2 regardless of the potential level at the output node 5a. The potential level at the output node 4a is twice inverted, and the output circuit 2 and 3 changes the output pulse signal PLS2 to the high level at time t3, and a time delay T2 is introduced between the rise of the input pulse signal PLS1 and the pulse rise of the output pulse signal PLS2.

When the NAND gate 4 changes the output node to the high level, the delay circuit 6 starts to measure the delay time T3. However, the delay circuit 6 maintains the output node 6b at the high level until the expiry of the delay time T3. The NAND gate 4 directly supplies the high level from the output node 4a to the other input node of the NAND gate 5, and the NAND gate 5 changes the output node 5a from the high level to the low level.

The input pulse signal PLS1 has the pulse duration T1. Although the input pulse signal PLS1 is changed to the low level at time t4 and, accordingly, the inverter 1 changes the output node 1a to the high level, the NAND gate 5 supplies the low level to the NAND gate 4. The output node 5a at the low level forces the NAND gate 4 to keep the output node 4a at the high level even after time t4.

The delay time T4 is expired at time t5, and the delay circuit 6 changes the output node 6b to the low level. Then, the NAND gate 5 changes the output node 5a to the high level, and the output node 5a at the high level allows the NAND gate 4 to change the output node 4a to the low level at time t6. The output circuit 2 and 3 changes the output pulse signal PLS2 to the low level at time t7. Thus, the output pulse signal PLS2 has the pulse duration T3, i.e., from time t3 to time t7. The pulse duration T3 is defined by the delay time T4, and is longer than the pulse duration of the input pulse signal PLS1. The input pulse signal PLS1 rises at time t8, again, and the pulse period T9 is from time t1 to time t8.

The next pulse period T10 starts at time t8. Although a sequence L2 in the pulse period T10 is basically similar to the above described sequence L1, the delay circuit 6 changes the output node 6b at different timings. As described hereinbefore, the NAND gate 4 changes the output node 4a to the low level at time t6. The delay circuit 6 propagates the low level toward the output node 6b, and the low level reaches the final inverter 6a at time t11. In other words, the delay circuit 6 introduces the delay time T5 into the propagation of the low level from the output node 4a to the final inverter 6a, and changes the output node 6b to the high level at time t11. The NAND gate 4 changes the output node 4a to the high level at time t9 before time t11, and the delay circuit 6 starts to propagate the high level toward the output node 6b. In other words, the delay circuit 6 propagates the low level and the high level at interval between time t9 and time t11. For this reason, the delay circuit 6 changes the output node 6b to the high level at time t11, and, accordingly, the NAND gate 5 changes the output node 5a to the low level as indicated by L3. The output node 5a at the low level causes the NAND gate 4 maintains the output node 4a at the high level regardless of the potential level at the output node 1a.

The pulse duration T6 is from time t8 to time t12, and the input pulse signal PLS1 falls at time t12. Accordingly, the inverter 1 changes the output node 1a to the high level. However, the NAND gate 4 maintains the output node 4a at the high level due to the output node 5a at the low level, and the output circuit 2 and 3 keeps the output pulse signal PLS2 at the high level.

The high level at the output node 4a is propagated through the delay circuit 6, and reaches the final inverter 6a at time t13. The final inverter 6a changes the output node 6b to the low level at time t13, and the NAND gate 5 changes the output node 5a to the high level. As a result, the NAND gate 4 changes the output node 4a to the low level, and, accordingly, the output circuit 2 and 3 changes the output pulse signal PLS2 to the low level at time t14. Thus, the output pulse signal PLS2 is in the high level from time t10 to time t14, and the pulse duration T8 is defined as shown.

Figure 3:
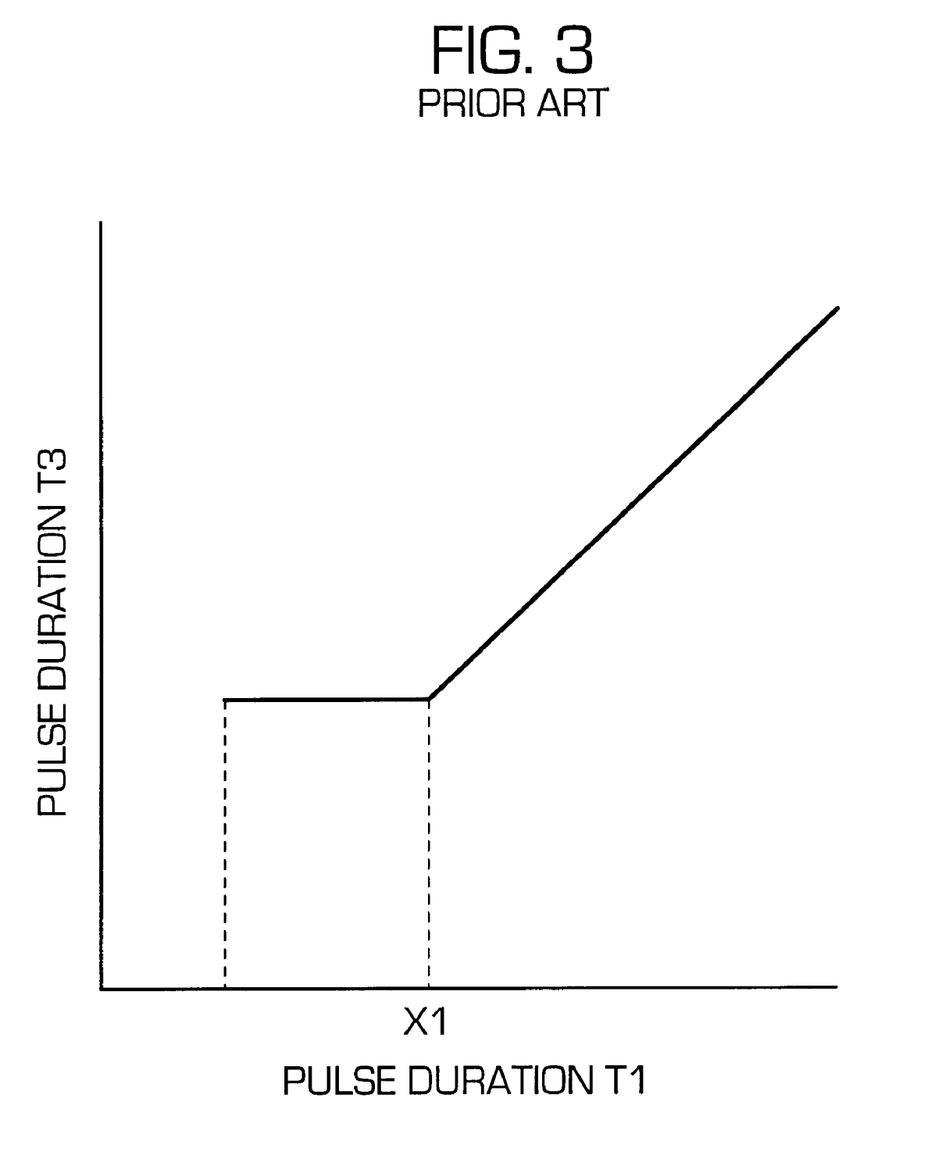
FIG. 3 is a graph showing the relation between pulse duration of the input pulse signal and the pulse duration of the output pulse signal.
Figure 4:
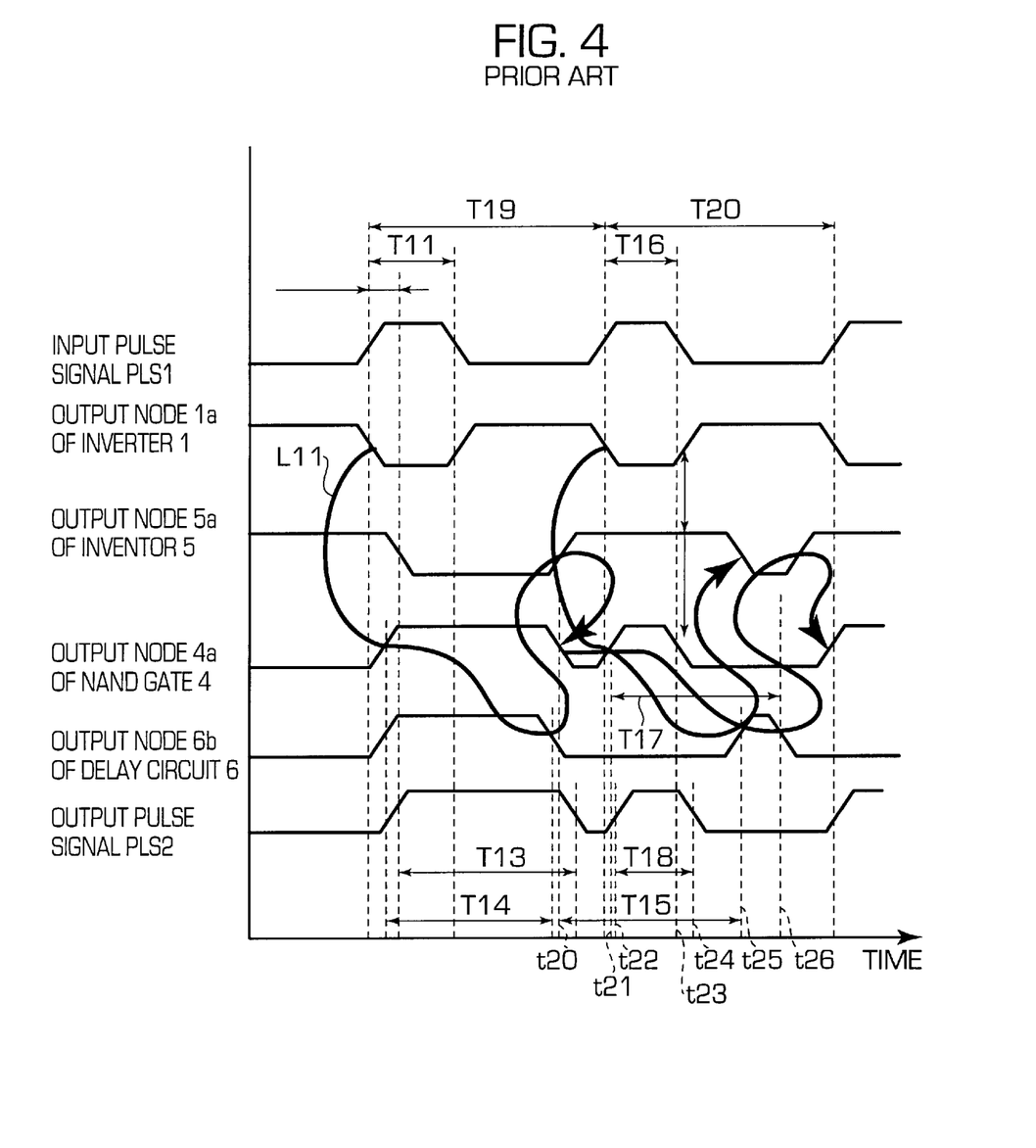
FIG. 4 is a diagram showing the signal waveforms in the prior art pulse duration changer responding to the high-frequency input pulse signal.

The prior art pulse duration changer prolongs the pulse duration, and generates the output pulse signal PLS2 with the long pulse duration from the input pulse signal PLS1 with the short pulse duration in so far as the input pulse signal PLS1 has the pulse duration and the pulse period appropriate for the delay time introduced by the delay circuit 6. If the input pulse signal PLS1 has a pulse duration T11 and T16 and a pulse period T19 and T20 both too short with respect to the delay time T14 and T15, a problem is encountered in the prior art pulse duration changer in that the output circuit 2 and 3 generates a short pulse in the output pulse signal PLS2 as shown in FIG. 3. The same problem takes place in the case where the delay time T14 and T15 is too long with respect to the pulse duration T11 and T16 and the pulse period T19 and T20.

The prior art pulse duration changer gives the pulse duration T13 to the output pulse signal PLS2 in the pulse period T19 through the sequence L11 same as the sequence L1, and the pulse duration T13 is as long as the design value. However, the prior art pulse duration changer generates the output pulse signal PLS2 shorter in pulse duration than the design value in the pulse period T20. The short pulse duration T18 is due to the fall of the input pulse signal PLS1 earlier than the expiry of the delay time T15 as described hereinbelow.

Upon completion of the sequence L11, the NAND gate 4 changes the output node 4a to the low level at time t20, and the delay circuit 6 starts to propagate the low level toward the final inverter 6a. The low level reaches the final inverter 6a at time t25, and the final inverter 6a changes the output node 6b to the high level. While the delay circuit 6 is propagating the low level to the final inverter 6a, the output node 6b is maintained at the low level, and the NAND gate 5 fixes the output node 5a to the high level.

In this situation, the input pulse signal PLS1 falls at time t23, and, accordingly, the inverter 1 changes the output node 1a to the high level. The NAND gate 4 is enabled with the output node 5a at the high level, and the NAND gate 4 changes the output node 4a to the low level. As a result, output circuit 2 and 3 changes the output pulse signal PLS2 to the low level, and the pulse duration T18 becomes shorter than the pulse duration T14.

The delay time T14 and T15 are defined by the series of inverters 6a, and is not changeable. Therefore, the short pulse duration T18 is inherent in the prior art pulse duration changer under the extremely short input pulse. When the delay time T14 and T15 is too, the prior art pulse duration changer also generates a short output pulse.

Thus, the prior art pulse duration changer can respond to a low-frequency input pulse signal, but can not respond to an ultra high frequency input pulse signal.

The present inventor searched documents already published for a pulse duration changer capable of keeping the output pulse duration constant, and found Japanese Patent Publication of Examined Application No. 3-8037 and Japanese Patent Publication of Unexamined Application Nos. 4-358397 and 8-180677.

Japanese Patent Publication of Examined Application No. 3-8037 discloses a pulse generating circuit. An address signal and the complementary address signal are supplied to the pulse generating circuit disclosed therein, and the pulse generating circuit is responsive to an address signal and the inverted signal thereof for producing an internal pulse signal. The pulse generating circuit includes two pairs of input NAND gates an output NAND gate and resettable delay circuits connected between the two pairs of input NAND gates. When the address change occurs too early, the input NAND gates reset the resettable delay circuits, and keeps the output pulse signal low. The prior art pulse generating circuit aims at prolonging the output pulse duration only when the input address signal unusually changes the address.

Japanese Patent Publication of Unexamined Application No. 4-358397 discloses a write-in pulse generator incorporated in a semiconductor memory device. The prior art write-in pulse generator comprises an edge trigger type register and a delay circuit connected between the reset terminal and the output node of the edge trigger type register. The edge trigger register is responsive to an input clock signal for generating a write-in clock signal, and the write-in clock signal is constant in pulse duration regardless of the pulse duration of the input clock signal. Japanese Patent Publication of Unexamined Application No. 8-180677 discloses a clock input circuit incorporated in a synchronous dynamic random access memory device. The prior art clock input circuit is implemented by a one-shot pulse generator, and an input clock signal triggers the one-shot pulse generator. Even if the input clock is undesirable changed within a short time, the one short pulse generator keeps the pulse duration constant.

The above-described prior art pulse generating circuits keep the pulse duration of the output pulse signal constant regardless of undesirable fluctuation of the input pulse signal. However, it is impossible to respond to an ultra-high-frequency input clock signal.

SUMMARY OF THE INVENTION

It is therefore an important object of the present invention to provide a pulse duration changer, which is responsive to an ultra-high-frequency input clock signal so as to keep the pulse duration of an output pulse signal constant.

It is also an important object of the present invention to provide a method for changing a pulse duration used in the pulse duration changer.

The present inventor contemplated the problem inherent in the prior art, and noticed that the delay circuit 6 started to introduce the delay time T14 and T15 at the potential change at the output node 4a. This meant that the function of the delay circuit 6 was independent on the input pulse signal PLS1. In other words, the delay circuit 6 is synchronized with the potential change at the output node of the NAND gate 4, but not with the input pulse signal PLS1. In this situation, if the input pulse signal PLS1 had an ultra high frequency, the delay time extended over two pulse periods T19 and T20, and the fall of the input pulse signal PLS1 at time t23 became earlier than the expiry of the delay time T15.

To accomplish the object, the present invention proposes to cause a delay circuit to synchronize with an input pulse signal.

In accordance with one aspect of the present invention, there is provided a pulse duration changer for generating an output pulse signal different in pulse duration from an input pulse signal comprising an input circuit supplied with the input pulse signal and generating a first internal pulse signal synchronous with the input pulse signal, an output circuit supplied with a preliminary output signal different in pulse duration from the input pulse signal and generating the output pulse signal synchronous with the preliminary output pulse signal, and a pulse width regulating circuit connected between the input circuit and the output circuit and initiating a control sequence in response to the first internal pulse signal for producing a control signal used for defining the pulse duration of the preliminary output signal.

In accordance with another aspect of the present invention, there is provided a method for changing a pulse duration between an input pulse signal and an output pulse signal substantially concurrently generated comprising the steps of a) detecting a first timing repeated in the waveform of the input pulse signal, b) starting to count a first delay time longer than the pulse duration of the input pulse signal at a second timing approximately equal to the first timing for defining a pulse duration of a control signal, c) terminating the pulse duration of the control signal at a third timing when the first delay time is expired, and d) terminating the pulse duration of the output pulse signal at a fourth timing approximately equal to the third timing.

BRIEF DESCRIPTION OF THE DRAWINGS

The features and advantages of the pulse duration changer and the method will be more clearly understood from the following description taken in conjunction with the accompanying drawings in which.

DESCRIPTION OF THE PREFERRED EMBODIMENT

Figure 5:
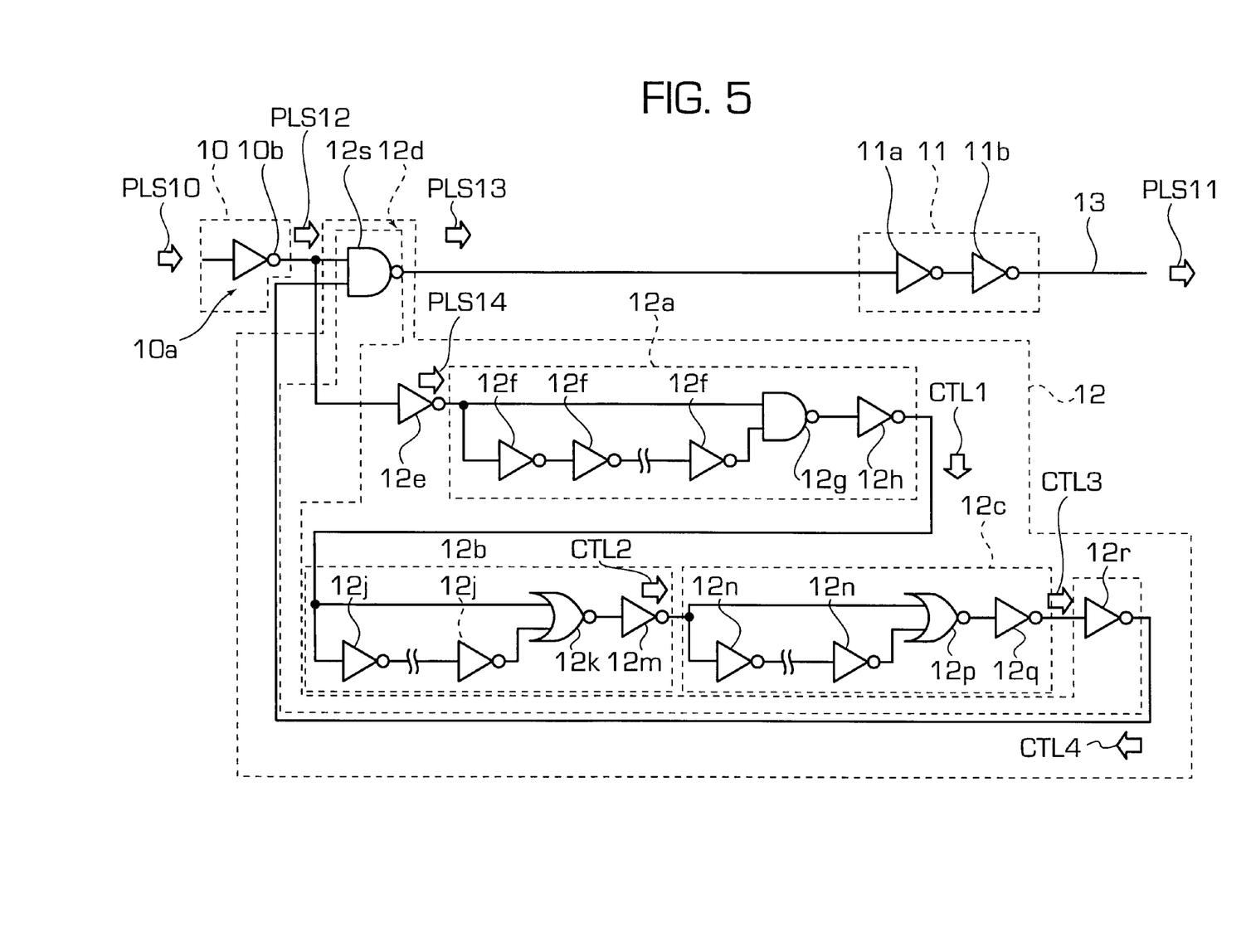
FIG. 5 is a circuit diagram showing the circuit configuration of a pulse duration changer according to the present invention.

Referring to FIG. 5 of the drawings, a pulse duration changer embodying the present invention largely comprises an input circuit 10, an output circuit 11 and a pulse duration regulating circuit 12 connected between the input circuit 10 and the output circuit 11. An ultra-high-frequency input pulse signal PLS10 is supplied to the input circuit 10. The input circuit 10 amplifies the high-frequency input pulse signal PLS10, and supplies an inverted pulse signal PLS12 to the pulse duration regulating circuit 12. The pulse duration regulating circuit 12 generates a preliminary output pulse signal PLS13 longer in pulse duration than that of the inverted pulse signal PLS12 and, accordingly, the ultra-high-frequency input pulse signal PLS10, and keeps the pulse duration of the preliminary output pulse signal PLS13 constant. The pulse duration regulating circuit 12 is operating in synchronism with the input pulse signal PLS10, and introduces a delay time shorter than the minimum pulse duration guaranteed by the manufacturer as described hereinlater. As a result, the preliminary output pulse signal PLS13 has a constant pulse duration. The output circuit 11 produces the output pulse signal PLS11 from the preliminary output pulse signal PLS13.

Although the input circuit 10 amplifies the ultra-high-frequency input pulse signal PLS10, the function of the input circuit is simply represented by an inverter 10a, and the inverted pulse signal PLS12 appears at an output node of the inverter 10a. In this instance, the inverter 10a is implemented by a differential amplifier, which is responsive to the ultra-high-frequency input pulse signal PLS10.

The output circuit 11 includes a series of inverters 11a and 11b. The inverter 11a shapes the waveform of the preliminary output pulse signal PLS13, and the other inverter 11b drives an output signal line 13 with the output pulse signal PLS11. The output pulse signal PLS11 varies the potential level in a range appropriate to metal-insulator-semiconductor type field effect transistors.

The pulse duration regulating circuit 12 is largely broken down into four sections 12a, 12b, 12c and 12d, i.e., a pulse width squeezer 12a, a first-stage pulse width stretcher 12b, a second-state pulse width stretcher 12c and a pulse width regulator 12d. The pulse width squezer 12a and the pulse width stretchers 12b/12c are connected in series, and the forms a control loop between the input circuit 10 and the pulse width regulator 12d together with an input inverter 12e, which is also incorporated in the pulse duration regulating circuit 12. The inverter 12e shapes the waveform of the inverted pulse signal PLS12.

The inverted pulse signal PLS12 is supplied to the input inverter 12e, and the input inverter 12e supplies a pulse signal PLS14 to the pulse width squeezer 12a. The pulse width squeezer 12a produces a first control pulse signal CTL1 from the inverted pulse signal PLS12. Although the first control pulse signal CTL1 is approximately equal in pulse period to the pulse signal PLS14, the inverted pulse signal PLS12 and the input pulse signal PLS10, the first control pulse signal CTL1 is shorter in pulse duration than the pulse signal PLS14 and, accordingly, the input pulse signal PLS10. The control pulse signal CTL1 is supplied to the first-stage pulse width stretcher 12b, and the first-stage pulse width stretcher 12b produces a second control pulse signal CTL2 from the first control pulse signal CTL1. The pulse duration of the second control pulse signal CTL2 is longer than that of the first control pulse signal CTL1. The second control pulse signal CTL2 is supplied to the second-stage pulse width stretcher 12c, and the second-stage pulse width stretcher 12c produces a third control pulse signal CTL3 from the second control pulse signal CTL2. The third control pulse signal CTL3 is longer in pulse duration than the second control pulse signal CTL2 and than the input pulse signal PLS10. The third control pulse signal CTL3 is supplied to the pulse width regulator 12d, and the pulse width regulator 12d produces the intermediate pulse signal PLS13 from the inverted pulse signal PLS12 and the third control signal CTL3. Thus, the pulse width squeezer 12a and the pulse width stretchers 12b and 12c directly produces the third control signal CTL3 from the inverted signal PLS12 of the input pulse signal PLS10. In other words, the inverted pulse signal PLS12 and, accordingly, the input pulse signal PLS10 directly defines a starting point or an end point of the pulse width regulation.

The pulse width squeezer 12a includes a series of inverters 12f, a NAND gate 12g and an inverter 12h. The series of inverters 12f introduces a predetermined delay time between the potential change of the pulse signal PLS14 and the arrival of the pulse signal PLS14 at the final inverter 12f, and serves as a delay circuit. The number of inverters 12f is equal to an odd number, and the odd number is determined on the basis of the delay time to be required. The pulse signal PLS14 is directly supplied to one input node of the NAND gate 12g and to the other input node of the NAND gate 12g through the series of inverters 12f, and the output node of the NAND gate 12g is connected to the input node of the inverter 12h. The delay time introduced by the inverters 12f is hereinbelow referred to as "first delay time".

The pulse signal PLS14 is assumed to be in the low level. The final inverter 12f supplies the high level to the NAND gate 12g, and the NAND gate 12g yields the high level. For this reason, the inverter 12h keeps the control pulse signal CTL1 at the low level. When the pulse signal PLS14 is changed to the high level, the NAND gate 12g changes the output nodes thereof to the low level, and the inverter 12h changes the control pulse signal CTL1 to the high level. The series of inverters 12f starts to propagate the high level toward the final inverter 12f, and the high level arrives at the final inverter 12f at the expiry of the first delay time. Then, the final inverter 12f changes the output node thereof to the low level, and the NAND gate 12g changes the output node thereof to the high level. As a result, the inverter 12h recovers the control pulse signal CTL1 to the low level. Thus, the pulse duration of the control pulse signal CTL1 is approximately equal to the first delay time introduced by the series of inverters 12f, and the pulse rise of the control pulse signal CTL1 is defined by the pulse signal PLS14 and, accordingly, the input pulse signal PLS10.

The pulse width stretchers 12b and 12c are similar in circuit configuration to one another except the number of inverters serving as a delay circuit. The pulse width stretcher 12b includes a series of inverters 12j, a NOR gate 12k and an inverter 12m, and the number of inverters 12j is equal to an even number less than the first odd number. The number of inverters 12j is hereinbelow referred to as "first even number", and a delay time introduced by the inverters 12j is referred to as "second delay time". The first even number is determined on the basis of the second delay time to be required, and the delay time defines the pulse duration of the second control pulse signal CTL2. The pulse duration of the second control signal CTL2 is equal to the sum of the first and second delay times. The first even number is less than the odd number, and the second delay time is shorter than the first delay time.

The pulse width stretcher 12b behaves as follows. While the input pulse signal PLS10 and, accordingly, the pulse signal PLS14 and the first control pulse signal CTL1 are staying in the low level, the final inverter 12j supplies the low level to the NOR gate 12k, and the NOR gate 12k yields the high level at the output node thereof. The inverter 12m keeps the second control pulse signal CTL2 at the low level. When the input pulse signal PLS10 and, accordingly, the pulse signal PLS14 are changed to the high level, the pulse width squeezer 12a raises the first control pulse signal CTL1, and the NOR gate 12k changes the output node thereof to the low level. Then, the inverter 12m changes the second control pulse signal CTL2 to the high level. While the series of inverters 12j is propagating the high level toward the input node of the NOR gate 12k, the inverter 12m keeps the second control pulse signal CTL2 at the high level. When the high level reaches the input node of the NOR gate 12k, the first control pulse signal CTL1 is still in the high level, and the NOR gate 12k keeps the output node thereof at the low level. For this reason, even after the first control pulse signal CTL1 is recovered to the low level, the NOR gate 12k keeps the output node thereof at the low level, and the second control pulse signal CTL2 remains at the high level. When the second delay time is expired after the recovery of the first control pulse signal CTL1 to the low level, both input nodes of the NOR gate 12k are in the low level, and the inverter 12m changes the second control pulse signal CTL2 to the low level.

Similarly, the pulse width stretcher 12c includes a series of inverters 12n, a NOR gate 12p and an inverter 12q, and the number of inverters 12n is equal to an even number less than the first even number and, accordingly, the odd number. The number of inverters 12n is hereinbelow referred to as "second even number", and the series of inverters 12n introduces a third delay time shorter than the second delay time. The pulse duration of the control signal CTL3 is equal to the sum of the first, second and third delay times.

While the second control pulse signal CTL2 is staying in the low level, the final inverter 12n supplies the low level to the NOR gate 12p, and the NOR gate 12p yields the high level at the output node thereof. The inverter 12q keeps the third control pulse signal CTL3 at the low level. When the pulse width stretcher 12b raises the second control pulse signal CTL2, the NOR gate 12p changes the output node thereof to the low level. Then, the inverter 12q changes the third control pulse signal CTL3 to the high level. While the series of inverters 12j is propagating the high level toward the input node of the NOR gate 12p, the inverter 12q keeps the third control pulse signal CTL3 at the high level. When the high level reaches the input node of the NOR gate 12p, the second control pulse signal CTL2 is still in the high level, and the NOR gate 12p keeps the output node thereof at the low level. For this reason, even after the second control pulse signal CTL2 is recovered to the low level, the NOR gate 12p keeps the output node thereof at the low level, and the third control pulse signal CTL3 remains at the high level. When the third delay time is expired after the recovery of the second control pulse signal CTL2 to the low level, both input nodes of the NOR gate 12p are in the low level, and the inverter 12q changes the third control pulse signal CTL3 to the low level.

The first delay time is designed to be equal to or less than the shortest pulse duration guaranteed by the manufacturer. For this reason, the first control pulse signal CTL1 is as short in pulse duration as the minimum pulse duration guaranteed by the manufacturer, and the pulse duration is prolonged through the pulse width stretchers 12b and 12c. The pulse width squeezer 12a changes the first control pulse signal CTL1 in synchronism with the pulse rise of the signal PLS14 and, accordingly, the input pulse signal PLS10, and the first delay time is shorter than the minimum pulse duration. For this reason, the input pulse signal PLS10 never rises before the expiry of the first delay time, and the control pulse signal CTL1 is constant in the pulse duration. The second control pulse signal CTL2 is prolonged on the basis of the first control pulse CTL1, and the third control pulse signal CTL1 is prolonged on the basis of the second control pulse signal CTL2. For this reason, the control pulse signals CTL1, CTL2 and CT13 have respective constant values of the pulse duration.

The pulse width regulator 12 includes an inverter 12r connected to the pulse width stretcher 12c and a NAND gate 12s having input node connected to the inverters 12r and 10a. The inverter 12r inverts the third control pulse signal CTL3, and supplies the inverted pulse signal CTL4 to the NAND gate 12s. While the inverted pulse signal CTL4 is in the high level, the NAND gate 12s is enabled, and inverts the inverted signal PLS12 for producing the preliminary output signal PLS13. However, while the inverted pulse signal CTL4 is in the low level, the NAND gate 12s yields the high level regardless of the potential level of the inverted pulse signal PLS12.

Figure 6:
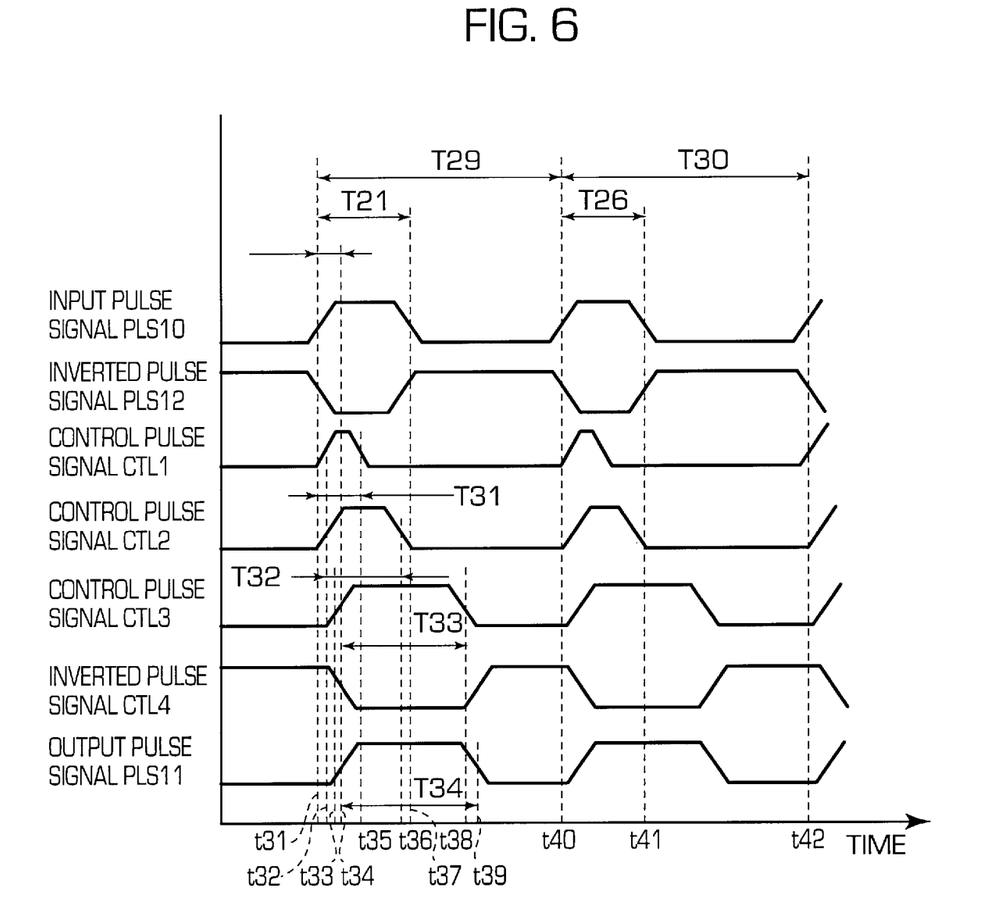
FIG. 6 is a diagram showing signal waveforms observed in the pulse duration changer.

The pulse duration changer according to the present invention behaves as follows. FIG. 6 illustrates the waveforms of the essential pulse signals PLS10, PLS12, CT11, CTL2, CTL3, CT14 and PLS11. The input pulse signal PLS10 periodically rises at time t31 and time t40, and falls at time t37 and time t41. The lapse of time between time t31 and t40 and time t40 and t42 is the pulse period T29 and T30 of the input pulse signal PLS10, and the pulse duration T21 and T26 is equal to the lapse of time between time t31 and t40 and time t37 and t41.

When the input pulse signal PLS10 rises, the inverter 10a changes the inverted pulse signal PLS12 to the low level, and the inverter 12e changes the pulse signal PLS14 to the high level. Therefore, the pulse signal PLS14 is considered to be substantially in-phase to the input pulse signal PLS10.

The pulse width squeezer 12a changes the first control signal CTL1 at time t32 in response to the pulse rise of the signal PLS14, the pulse width stretcher 12b changes the second control signal CTL2 at a timing approximately equal to time t32 in response to the first control signal CTL1, the pulse width stretcher 12c changes the third control signal CTL3 at time t33 in response to the second control signal CTL2, and the inverter 12r generates the inverted pulse signal CTL4 at a timing approximately equal to time t33 in response to the third control signal CTL3. The time interval between time t32 to time t33 are extremely short. For this reason, the input pulse signal PLS10 initiates the generation of the inverted pulse signal CTL4.

The pulse width squeezer 12a introduces the first time delay into the propagation of the inverted pulse signal PLS14, and recovers the first control signal CTL1 to the low level at time t35. The first control signal CTL1 has the pulse duration T31 from time t32 to time t35, and the first pulse duration is equal to the minimum pulse duration guaranteed by the manufacturer. As a result, the pulse duration of the first control pulse signal CTL1 is constant, and is never shortened.

The pulse width stretcher 12b introduces the second time delay into the propagation of the first control signal CTL1, and recovers the second control signal CTL2 to the low level at time t36. The second control signal CTL2 has the pulse duration T32 from time t32 to time t36, and the pulse duration T32 is longer than the first control signal CTL1 and shorter than the pulse duration T21.

The pulse width stretcher 12c introduces the third time delay into the propagation of the second control signal CTL2, and recovers the third control signal CTL3 to the low level at time t38. The third control signal CTL2 has the pulse duration T33 from time t33 to time t38, and the pulse duration T33 is longer than not only those T31 and T32 of the first and second control signals CTL1 and CTL2 but also the duration T21 of the input pulse signal PLS10.

The inverter generates the inverted signal CTL4 from the control pulse signal CTL3, and supplies the inverted signal CTL4 to the NAND gate 12s. As described hereinbefore, the inverted signal CT14 falls immediately after the pulse rise of the input pulse signal PLS10, and causes the NAND gate 12s to change the preliminary output signal PLS13 to the high level. The inverted signal CTL4 is staying at the low level as long as the pulse duration T33. For this reason, even though the input pulse signal PLS10 is recovered to the low level at time t36, the NAND gate 12s keeps the preliminary output signal PLS13 at the high level, and the preliminary output signal PLS13 has the pulse duration T34 longer than that of the input pulse signal PLS10. The output circuit 11 generates the output pulse signal PLS11 from the preliminary output pulse signal PLS13, and the output pulse signal PLS11 is equal in pulse duration to the preliminary output pulse signal PLS13.

The third control signal CTL3 is recovered to the low level at time t38, and the inverted pulse signal CTL4 is changed to the high level. Then, the high level is supplied to both inputs of the NAND gate 12s, and the NAND gate 12s recovers the preliminary output pulse signal PLS13 to the low level.

In the pulse period T30, the input pulse signal PLS10 causes the pulse width regulating circuit 12 to initiate the above-described control sequence, and the pulse width regulating circuit 12 keeps the pulse duration of the preliminary output signal PLS13 constant.

As will be appreciated from the foregoing description, the pulse width regulating circuit 12 initiates the control sequence at the pulse rise of the input pulse signal PLS10, and terminates the control sequence before the next pulse period. For this reason, the input pulse signal PLS10 never rises before the expiry of any one of the delay time, and undesirable short pulse is never produced.

Even if the pulse duration T21 and T26 of the input pulse signal PLS10 is decreased to the minimum pulse duration, the pulse width squeezer 12a keeps the pulse duration T31 constant, and the makes the control sequence stable.

The series of inverters 12f, 12j; and 12n serves as a delay circuit, inverters 12h, 12m and 12q, the NAND gate 12g and the NOR gates 12k/12p as a whole constitute a control signal generator, and the inverter 12r and the NAND gate 12s form in combination a logic circuit. The pulse width stretchers 12b and 12c serve as pulse width sub-stretchers.

Although a particular embodiment of the present invention has been shown and described, it will be apparent to those skilled in the art that various changes and modifications may be made without departing from the spirit and scope of the present invention.

One or more than two pulse width stretchers may be incorporated in the pulse width regulating circuit 12. The number of stages is not important in so far as the control pulse signals CTL1, CTL2 and CTL3 are synchronized with the input pulse signal PLS10.

In the preferred embodiment, the NAND gates and the NOR gates are used in the pulse duration regulating circuit. However, other kinds of logic gate such as an AND gate and an OR gate are available for the pulse duration regulating circuit in so far as the control pulse signals have values of pulse duration different from one another as similar to those of the preferred embodiment.

What is claimed is:

1. A pulse duration changer for producing an output pulse signal different in pulse duration from an input pulse signal, comprising:

an input circuit supplied with said input pulse signal, and generating a first internal pulse signal synchronous with said input pulse signal;

an output circuit supplied with a preliminary output signal different in pulse duration from said input pulse signal, and generating said output pulse signal synchronous with said preliminary output pulse signal; and a pulse width regulating circuit, connected between said input circuit and said output circuit, which initiates a control sequence in response to said first internal pulse signal and which produces a control signal and which is used for defining the pulse duration of said preliminary output signal, wherein said pulse width regulating circuit includes:
a pulse width squeezer responsive to said first internal pulse signal for counting a first delay time, producing a second internal pulse signal substantially synchronous with said first internal pulse signal and shorter in pulse duration than said input pulse signal and terminating the pulse duration of said second internal pulse signal when said first delay time has expired, a pulse width stretcher responsive to said second internal pulse signal for counting a second delay time, producing said control signal in response to said second internal pulse signal and terminating said control signal when said second delay time has expired, and a first logic circuit having input nodes supplied with said control signal and said first internal pulse signal and responsive to said control signal for producing said preliminary output pulse signal.

2. The pulse duration changer as set forth in claim 1, in which said first delay time is shorter than the pulse duration of said input pulse signal, and said second delay time is longer than a particular delay time determined by a delay circuit incorporated in said pulse width stretcher and shorter than said first delay time.

3. The pulse duration changer as set forth in claim 1, in which the pulse duration of said second internal pulse signal is as short as a minimum pulse duration of said pulse duration changer.

4. The pulse duration changer as set forth in claim 1, in which said pulse width stretcher includes a plurality of pulse width sub-stretchers connected in series between said pulse width squeezer and said first logic circuit and successively increasing the pulse duration from said second internal pulse signal to said control signal.

5. The pulse duration changer as set forth in claim 4, wherein said plurality of pulse width sub-stretchers comprise:

a first pulse width sub-stretcher responsive to said second internal pulse signal for counting a third delay time, producing a third internal pulse signal having a pulse duration between the pulse duration of said second internal pulse signal and the pulse duration of said control signal substantially in synchronism with said pulse width squeezer and terminating said third internal pulse signal when said third delay time has expired, and a second pulse width sub-stretcher responsive to said third internal pulse signal for counting a fourth delay time, producing said control signal in synchronism with said first pulse width sub-stretcher and terminating said control signal when said fourth delay time has expired.

6. The pulse duration changer as set forth in claim 4, wherein said pulse width squeezer comprises:

a second logic circuit having a first input node directly supplied with said first internal pulse signal, a second input node and a first output node for producing said second internal pulse signal; and a first delay circuit for introducing said first delay time into a signal propagation of said first internal pulse signal to said second input node, and wherein each of said plurality of pulse width sub-stretchers has
a third logic circuit having a third input node directly supplied with one of said second internal pulse signal and an intermediate pulse signal produced by another of said plurality of pulse width sub-stretchers, a fourth input node and a second output node for producing one of said control signal and another intermediate pulse signal having a pulse duration between said pulse duration of said second internal pulse signal and said pulse duration of said control signal, said third logic circuit terminating the pulse duration of said one of said control signal and said another intermediate pulse signal when said second delay time or a third delay time between said first delay time and said second delay time has expired; and a second delay circuit for introducing a particular delay time shorter than said second delay time or said third delay time into a propagation of said one of said second internal pulse signal and said intermediate pulse signal to said fourth input node.

7. The pulse duration changer as set forth in claim 6, in which said first internal pulse signal is substantially in-phase to said input pulse signal, and said second internal pulse signal, said intermediate pulse signal, said another internal pulse signal and said control signal are substantially in-phase to said first internal pulse signal.

8. The pulse duration changer as set forth in claim 7, in which said first logic circuit, said second logic circuit and said third logic circuit includes a series combination of a first inverter and a first NAND gate connected between said plurality of pulse width sub-stretchers and said output circuit, a series combination of a second NAND gate having said first and second input nodes and a second inverter having said first output node and a series combination of a NOR gate having said third and fourth input nodes and a third inverter having said second output node, respectively, and said first delay circuit and said second delay circuit includes an odd number of fourth inverters connected in series and an even number of fifth inverters connected in series, respectively.

9. The pulse duration changer as set forth in claim 1, in which said input circuit carries out an amplification on said input pulse signal.

10. The pulse duration changer as set forth in claim 1, in which said output circuit carries out a waveform shaping on said preliminary output pulse signal, and changes the potential level of said output pulse signal within a predetermined voltage potential range.

11. The pulse duration changer as set forth in claim 1, wherein the pulse duration of said second internal pulse signal is independent of the pulse duration of said input pulse signal.

12. A method for changing a pulse duration between an input pulse signal and an output pulse signal substantially concurrently generated, comprising:

a) detecting a first timing repeated in the waveform of said input pulse signal;

b) starting to count a first time longer than the pulse duration of said input pulse signal at a second timing approximately equal to said first timing for defining a pulse duration of a control signal, wherein said first time is independent of the pulse duration of said input pulse signal;

c) terminating said pulse duration of said control signal at a third timing when said first time has expired; and d) terminating the pulse duration of said out put pulse signal at a fourth timing approximately equal to said third timing.

13. A method for changing a pulse duration between an input pulse signal and an output pulse signal substantially concurrently generated, comprising:
   a) detecting a first timing repeated in the waveform of said input pulse signal;
   b) starting to count a first time longer than the pulse duration of said input pulse signal at a second timing approximately equal to said first timing for defining a pulse duration of a control signal;
   c) terminating said pulse duration of said control signal at a third timing when said first time has expired; and
   d) terminating the pulse duration of said output pulse signal at a fourth timing approximately equal to said third timing,
   wherein said operation b) includes:
      b-1) starting to count a second time at a fifth timing approximately equal to said first timing for defining a pulse duration of an intermediate pulse signal shorter than the pulse duration of said input pulse signal, and
      b-2) terminating said intermediate pulse signal at a six timing between said second timing and said third timing for making said control signal ready for said termination at said operation c).

14. A pulse duration changing circuit, comprising:
   an input circuit that receives an input pulse signal and generates an intermediate pulse signal that is synchronous with said input pulse signal;
   an output circuit that receives a preliminary output pulse signal and generates an output pulse signal, wherein a pulse duration of said preliminary output pulse signal is different than a pulse duration of said input pulse signal, wherein said output pulse signal is synchronous with said preliminary output pulse signal, and wherein the pulse duration of said preliminary output pulse signal is independent from the pulse duration of said input pulse signal;
   a pulse duration modification circuit that inputs said intermediate pulse signal and generates a first control signal based on said intermediate pulse signal; and
   a logic circuit that inputs said intermediate pulse signal and said first control signal and that outputs said preliminary output pulse signal based on said intermediate pulse signal and said first control signal.

15. The circuit as claimed in claim 14, wherein said pulse duration modification circuit comprises:
   a pulse width reduction circuit that inputs said intermediate pulse signal and generates a second control signal based on said intermediate pulse signal; and
   a pulse width expansion circuit that inputs said second control signal and generates said first control signal based on said second control signal.

16. The circuit as claimed in claim 15, wherein said pulse width expansion circuit comprises:
   a first pulse width stretcher circuit that inputs said second control signal and generates a third control signal based on said second control signal; and
   a second pulse width stretcher circuit that inputs said third control signal and generates said first control signal based on said third control signal.

17. The circuit as claimed in claim 14, wherein the pulse duration of said preliminary output pulse signal is substantially constant for a predetermined range of pulse durations of said input pulse signal.

18. A pulse duration changing circuit, comprising:
   an input circuit that receives an input pulse signal and generates an intermediate pulse signal that is synchronous with said input pulse signal;
   an output circuit that receives a preliminary output pulse signal and generates an output pulse signal, wherein a pulse duration of said preliminary output pulse signal is different than a pulse duration of said input pulse signal and wherein said output pulse signal is synchronous with said preliminary output pulse signal;
   a pulse duration modification circuit that inputs said intermediate pulse signal and generates a first control signal based on said intermediate pulse signal; and
   a logic circuit that inputs said intermediate pulse signal and said first control signal and that outputs said preliminary output pulse signal based on said intermediate pulse signal and said first control signal,
   wherein said pulse duration modification circuit comprises:
      a pulse width reduction circuit that inputs said intermediate pulse signal and generates a second control signal based on said intermediate pulse signal; and
      a pulse width expansion circuit that inputs said second control signal and generates said first control signal based on said second control signal, and
      wherein said second control signal has a pulse duration less than a pulse duration of said intermediate pulse signal and said first control signal has a pulse duration greater than said pulse duration of said intermediate pulse signal.

19. The circuit as claimed in claim 18, wherein said pulse duration of said intermediate pulse signal is substantially equal to said pulse duration of said input pulse signal.

20. The circuit as claimed in claim 19, wherein a pulse duration of said output pulse signal is greater than said pulse duration of said input pulse signal.

21. The circuit as claimed in claim 18, wherein the pulse duration of said preliminary output pulse signal is substantially constant for a predetermined range of pulse durations of said input pulse signal and wherein the pulse duration of said second control signal is substantially constant for a predetermined range of pulse durations of said input pulse signal.

22. The circuit as claimed in claim 18, wherein the pulse duration of said preliminary output pulse signal is independent of the pulse duration of said input pulse signal and wherein the pulse duration of said second control signal is independent of the pulse duration of said input pulse signal.

23. A pulse duration changing circuit, comprising:
   an input circuit that receives an input pulse signal and generates an intermediate pulse signal that is synchronous with said input pulse signal;
   an output circuit that receives a preliminary output pulse signal and generates an output pulse signal, wherein a pulse duration of said preliminary output pulse signal is different than a pulse duration of said input pulse signal and wherein said output pulse signal is synchronous with said preliminary output pulse signal;
   a pulse duration modification circuit that inputs said intermediate pulse signal and generates a first control signal based on said intermediate pulse signal; and
   a logic circuit that inputs said intermediate pulse signal and said first control signal and that outputs said preliminary output pulse signal based on said intermediate pulse signal and said first control signal, wherein said pulse duration modification circuit comprises:
- a pulse width reduction circuit that inputs said intermediate pulse signal and generates a second control signal based on said intermediate pulse signal; and
- a pulse width expansion circuit that inputs said second control signal and generates said first control signal based on said second control signal, wherein said pulse width expansion circuit comprises:
- a first pulse width stretcher circuit that inputs said second control signal and generates a third control signal based on said second control signal; and
- a second pulse width stretcher circuit that inputs said third control signal and generates said first control signal based on said third control signal, and wherein said second control signal has a pulse duration less than a pulse duration of said intermediate pulse signal, said third control signal has a pulse duration that is greater than said pulse duration of said second control signal, and said first control signal has a pulse duration greater than said pulse duration of said third control signal.

24. The circuit as claimed in claim 23, wherein said pulse duration of said first control signal is greater than said pulse duration of said intermediate pulse signal.

25. The circuit as claimed in claim 24, wherein said pulse duration of said intermediate pulse signal is substantially equal to said pulse duration of said input pulse signal.

26. The circuit as claimed in claim 23, wherein the pulse duration of said preliminary output pulse signal is substantially constant for a predetermined range of pulse durations of said input pulse signal.

27. The circuit as claimed in claim 23, wherein the pulse duration of said second control signal is substantially constant for a predetermined range of pulse durations of said input pulse signal.

28. The circuit as claimed in claim 23, wherein the pulse duration of said preliminary output pulse signal is independent of the pulse duration of said input pulse signal.

29. The circuit as claimed in claim 23, wherein the pulse duration of said second control signal is independent of the pulse duration of said input pulse signal.

30. A pulse duration changing circuit, comprising:
- an input circuit that receives an input pulse signal and generates an intermediate pulse signal that is synchronous with said input pulse signal;
- an output circuit that receives a preliminary output pulse signal and generates an output pulse signal, wherein a pulse duration of said preliminary output pulse signal is different than a pulse duration of said input pulse signal and wherein said output pulse signal is synchronous with said preliminary output pulse signal;
- a pulse duration modification circuit that inputs said intermediate pulse signal and generates said preliminary output pulse signal based on said intermediate pulse signal, wherein said pulse duration of said preliminary output pulse is substantially constant over substantially an entire predetermined range of potential pulse durations of said input pulse signal.

31. The circuit as claimed in claim 30, wherein said pulse duration modification circuit comprises:
- a pulse duration sub-modification circuit that inputs said intermediate pulse signal and generates a first control signal based on said intermediate pulse signal; and
- a logic circuit that inputs said intermediate pulse signal and said first control signal and that outputs said preliminary output pulse signal based on said intermediate pulse signal and said first control signal.

32. The circuit as claimed in claim 31, wherein said pulse duration sub-modification circuit comprises:
- a pulse width reduction circuit that inputs said intermediate pulse signal and generates a second control signal based on said intermediate pulse signal; and
- a pulse width expansion circuit that inputs said second control signal and generates said first control signal based on said second control signal.

33. The circuit as claimed in claim 32, wherein said second control signal has a pulse duration less than a pulse duration of said intermediate pulse signal and said first control signal has a pulse duration greater than said pulse duration of said intermediate pulse signal.

34. The circuit as claimed in claim 33, wherein said pulse duration of said intermediate pulse signal is substantially equal to said pulse duration of said input pulse signal.

35. The circuit as claimed in claim 34, wherein a pulse duration of said output pulse signal is greater than said pulse duration of said input pulse signal.

36. The circuit as claimed in claim 32, wherein said pulse width expansion circuit comprises:
- a first pulse width stretcher circuit that inputs said second control signal and generates a third control signal based on said second control signal; and
- a second pulse width stretcher circuit that inputs said third control signal and generates said first control signal based on said third control signal.

37. The circuit as claimed in claim 36, wherein said second control signal has a pulse duration less than a pulse duration of said intermediate pulse signal, said third control signal has a pulse duration that is greater than said pulse duration of said second control signal, and said first control signal has a pulse duration greater than said pulse duration of said third control signal.

38. The circuit as claimed in claim 37, wherein said pulse duration of said first control signal is greater than said pulse duration of said intermediate pulse signal.

39. The circuit as claimed in claim 38, wherein said pulse duration of said intermediate pulse signal is substantially equal to said pulse duration of said input pulse signal.

* * * * *